United States Patent [19]
Katoono et al.

[11] Patent Number: 5,482,001
[45] Date of Patent: Jan. 9, 1996

[54] PROCESS FOR PRODUCING LITHIUM NIOBATE SINGLE CRYSTAL

[75] Inventors: Tomoko Katoono, Iwaki; Hideki Tominaga, Kita-Ibaraki, both of Japan

[73] Assignee: Nippon Mektron, Ltd., Tokyo, Japan

[21] Appl. No.: 318,251

[22] Filed: Oct. 5, 1994

[30] Foreign Application Priority Data

Feb. 8, 1994 [JP] Japan .................................. 6-014301

[51] Int. Cl.$^6$ .................................................. C30B 15/02
[52] U.S. Cl. .................................. 117/4; 117/3; 117/937; 423/592
[58] Field of Search ................................ 117/1, 3, 4, 937, 117/948; 252/62.9; 423/592, 641

[56] References Cited

U.S. PATENT DOCUMENTS

| | | | |
|---|---|---|---|
| 4,234,557 | 11/1980 | Arendt et al. ........................... | 423/593 |
| 4,851,205 | 7/1989 | Mitomo ................................... | 423/327 |

OTHER PUBLICATIONS

"Congruent Composition & Li–Rich Phase Boundary of LiNbO$_3$"; Bryan, et al; J of American Chem Soc.; 68(9) pp. 493–496 (1985).

O'Bryan, et al., "Congruent Composition and Li–Rich Phase Boundary of LiNbO$_3$", J. Am. Ceram. Soc., vol. 68, No. 9, pp. 493–496.

Primary Examiner—R. Bruce Breneman
Assistant Examiner—Felisa Garrett
Attorney, Agent, or Firm—Foley & Lardner

[57] ABSTRACT

A process for producing a lithium niobate single crystal which comprises restricting the variation of the Curie point due to the effect of impurities within a specific range in the accurate evaluation of the composition of the lithium niobate single crystal by the use of the Curie point. To produce a lithium niobate single crystal by using, singly or in combination, lithium carbonate having a purity of 99.99% or higher and simultaneously satisfying the condition that the contents therein of elements Na, K, Mg, and Al are 5.0 ppm or less, 2.0 ppm or less, 0.5 ppm or less, and 0.9 ppm or less, respectively, and niobium pentoxide having a purity of 99.99% or higher and simultaneously satisfying the condition that the contents therein of elements Na, K, Mg, Al, and Cl are 3.0 ppm or less, 1.0 ppm or less, 0.5 ppm or less, 0.9 ppm or less, and 3.0 ppm or less, respectively, according to an ordinary method.

11 Claims, 3 Drawing Sheets

5,482,001

PROCESS FOR PRODUCING LITHIUM NIOBATE SINGLE CRYSTAL

BACKGROUND OF THE INVENTION

1. Field of the Invention

This invention relates to a process for producing a novel lithium niobate single crystal. More particularly, this invention relates to a process for producing a novel lithium niobate single crystal in which a compositional evaluation of crystals based on Curie point can be accurately conducted, and, as a result, a high-quality lithium niobate having a homogeneous composition can be produced with good reproducibility, whereby the yield at the time of producing an optical device can be improved.

2. Prior Art

As one of the processes for determining the composition of lithium niobate ($LiNbO_3$, generally abbreviated as LN) used for the production of optical devices and the like, measurement of Curie points (Tc) has been performed. It has been known that this temperature varies with the ratio of lithium (Li) to niobium (Nb) of the crystals and that the Curie point is raised with a great amount of Li. In order to determine the compositional change of lithium niobate single crystals by utilizing the above properties, the evaluation of the Curie point has been conducted. It is important to eliminate all other factors that cause a variation in the Curie point. Even if a difference in the Curie point is observed among samples, it cannot always be said that the difference is due to the compositional change. Consequently an accurate evaluation concerning the composition of the crystals cannot be obtained. We have investigated the factors that vary the Curie point and, as a result, found that there is a factor having an effect on the Curie point depending upon the type of impurities contained in lithium niobate and that factor becomes a great obstacle in the investigation of compositional change due to the Curie point.

SUMMARY OF THE INVENTION

Thus, an object of this invention is to provide a process for producing a lithium niobate single crystal in which process the variation of the Curie point due to the effect of impurities is restricted within a predetermined value when the composition of a lithium niobate single crystal is accurately evaluated from the Curie point.

DETAILED DESCRIPTION OF THE INVENTION

According to this invention, there is provided a process for producing a lithium niobate single crystal which comprises using lithium carbonate having a purity of 99.99% or higher and simultaneously satisfying the condition that its contents of specific elements Na, K, Mg and Al are 5.0 ppm or less, 2.0 ppm or less, 0.5 ppm or less, and 0.9 ppm or less, respectively, as a starting material for growing the crystal.

This invention also provides a process for producing a lithium niobate single crystal which comprises using niobium pentoxide having a purity of 99.99% or higher and satisfying simultaneously the condition that the contents therein of specific elements Na, K, Mg, Al and Cl are 3.0 ppm or less, 1.0 ppm or less, 0.5 ppm or less, 0.9 ppm or less and 3.0 ppm or less, respectively, as a starting material for growing the crystal.

This invention provides further a process for producing lithium niobate by using both of the above stated starting materials and a lithium niobate single crystal obtained by using each starting material alone or both in combination.

DESCRIPTION OF THE PREFERRED EMBODIMENTS

This invention will now be described more fully with respect to preferred embodiments thereof.

As stated in the above, it has been found that certain impurities contained in lithium niobate influence the Curie point. Therefore, in order to lessen errors in the Curie point of lithium niobate single crystal, when a crystal is prepared, a starting material of a low concentration of impurities which have an effect on Curie point should be used. In view of this point, we have conducted experiments to determine the type of the impurities and their allowable quantities.

When producing a lithium niobate single crystal, a starting material having a purity of 99.99% or higher is generally used, and lithium carbonate ($Li_2CO_3$) and niobium pentoxide ($Nb_2O_5$) are used as the crystal growing starting materials. We have investigated the effect on the Curie point due to the main impurities contained in lithium carbonate and niobium pentaoxide used as starting materials as stated in the above. Thirteen elements, which may be possibily contained in the starting materials, were selected as impurities. That is, they are sodium (Na), calcium (Ca), iron (Fe), potassium (K), tantalum (Ta), chlorine (Cl), zirconium (Zr), silicon (Si), tungsten (W), molybdenum (Mo), titanium (Ti), magnesium (Mg) and aluminum (Al).

Figure 1:
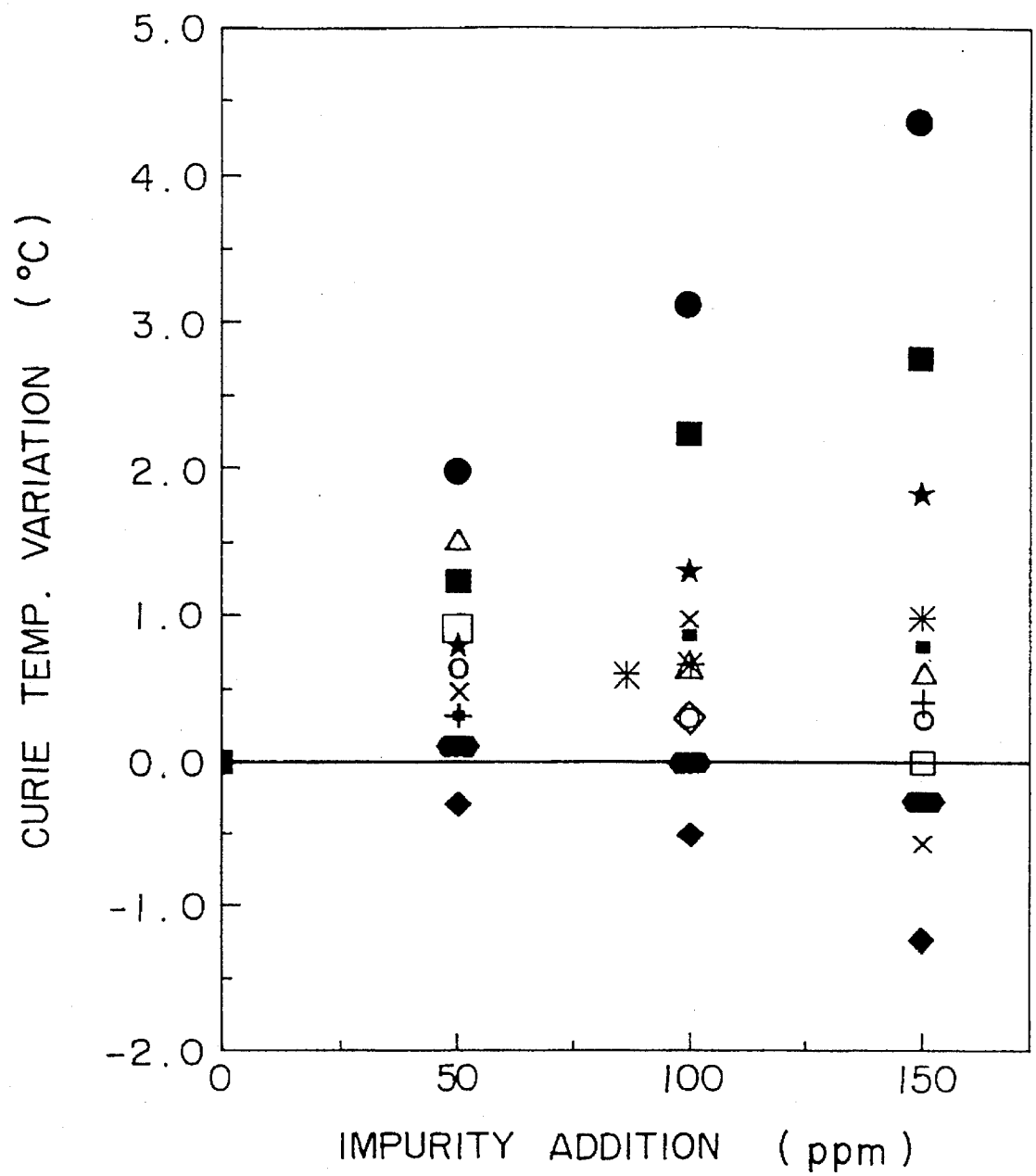
FIG. 1 is a graph indicating the effect of impurities in lithium niobate on the Curie point.
Figure 2:
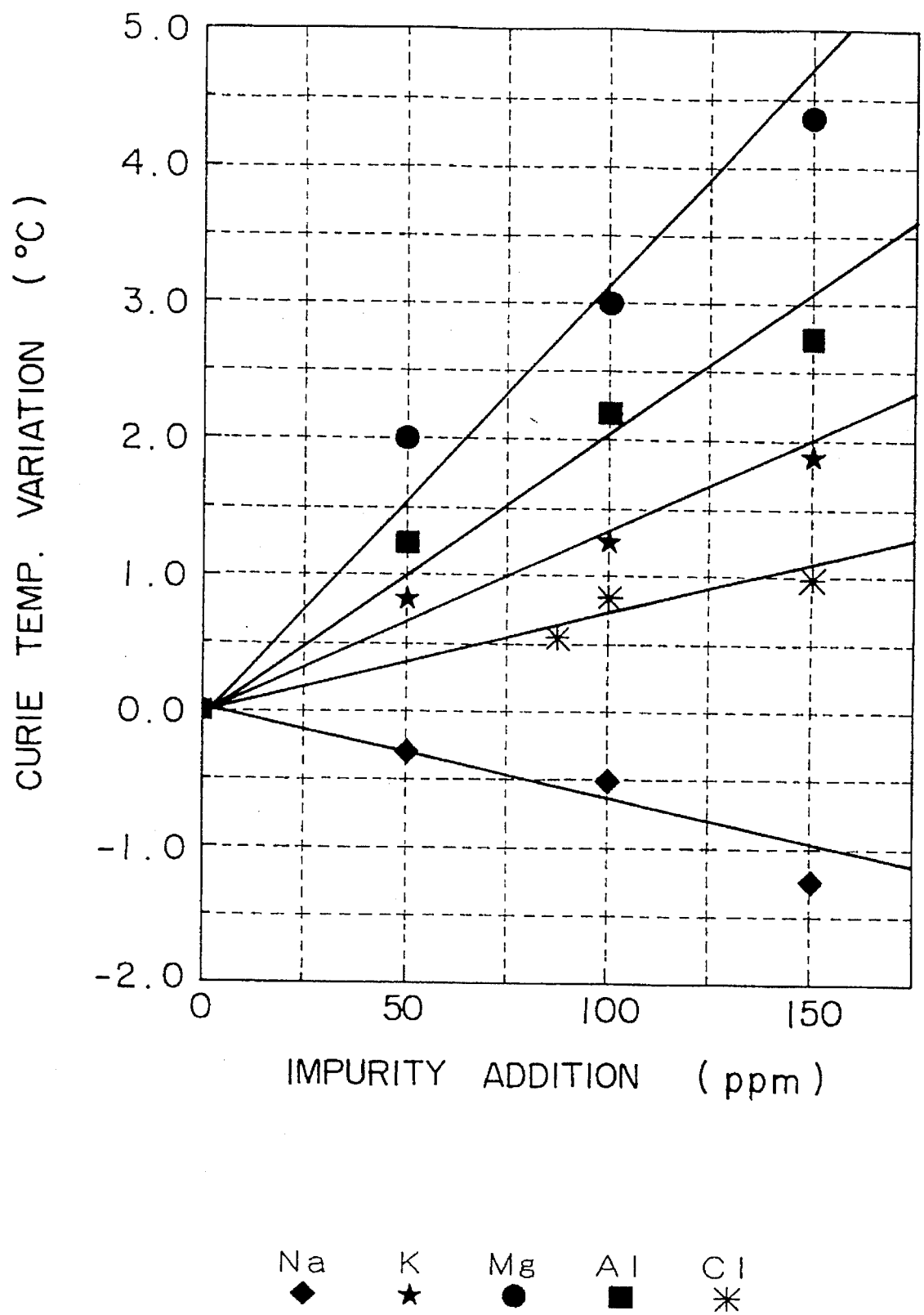
FIG. 2 is a graph indicating the effect of specific impurities in lithium niobate on the Curie point.

Therefore, each of impurities was added to the starting materials having the above stated purity in an amount of 50, 100 and 150 ppm (as to chlorine, 85, 100 and 150 ppm) and mixed therewith. Thereafter, the resultant product was heated at 1,240° C. for 10 hours in a muffle furnace. The starting material without the addition of the impurities was also heated under the same conditions as a control. Lithium niobate ceramics were obtained to measure the Curie point by the use of a starting material containing the respective impurities in the respective concentrations. In this case, the molar % of $Li_2O/Li_2O+Nb_2O_5$ in the starting materials is maintained at a constant value (48.60%). The result is shown in FIG. 1 as a relationship between the quantity of each element added and the variation of the Curie point. From FIG. 1, it is apparent that the effect of the elements Na, K, Mg, Al and Cl is great among the above stated thirteen elements. When the quantities of only these five elements are plotted and the points of each element are connected, a linear relationship as shown in FIG. 2 is obtained.

It is necessary to restrict the variation of the Curie point into a very small range in order to accurately carry out compositional evaluation of lithium niobate single crystals. Thus, we consider it necessary to restrict the variation of the Curie point due to the presence of impurities of the above stated five elements within ±0.1° C., and thus the allowable temperatures of these five elements are obtained from the graph in FIG. 2. The result obtained is shown in Table 1. As these elements are contained in the above stated two starting materials for growing crystals, allowable concentrations in the starting materials are, respectively, made ⅕ of each individual value, and allowable concentrations in lithium carbonate and niobium pentoxide are as shown in Table 2, respectively, in view of these weight ratios in the case of preparing lithium niobate.

TABLE 1

Concentration of respective impurities so that the amount of Tc varied is ±0.1° C.

| Elements of impurities | Na | K | Mg | Al | Cl |
| --- | --- | --- | --- | --- | --- |
| Concentration (ppm) so that the amount of Tc varied is ±0.1° C. | 15 | 7 | 3 | 5 | 14 |

TABLE 2

Allowable concentration of respective impurities in starting materials

| Starting material subjected Impurities | Starting material | | |
| --- | --- | --- | --- |
| | ($Li_2CO_3 + Nb_2O_5$) | $Li_2CO_3$ | $Nb_2O_5$ |
| Na | 3.0 | 5.0 | 3.0 |
| K | 1.4 | 2.0 | 1.0 |
| Mg | 0.6 | 0.5 | 0.5 |
| Al | 1.0 | 0.9 | 0.9 |
| Cl | 2.8 | — | 3.0 |

In order to prepare a lithium niobate single crystal in which the variation of Curie point due to the effect of impurities is restricted with ±0.1° C., it is found that, in the case of $Li_2CO_3$, the contents of respective elements Na, K, Mg, and Al as impurities must be 5.0 ppm or less, 2.0 ppm or less, 0.5 ppm or less, and 0.9 ppm or less, respectively, and, in the case of $Nb_2O_5$, the contents of respectively elements Na, K, Mg, Al, and Cl as impurities must be 3.0 ppm or less, 1.0 ppm or less, 0.5 ppm or less, 0.9 ppm or less, and 3.0 ppm or less, respectively.

Figure 3:
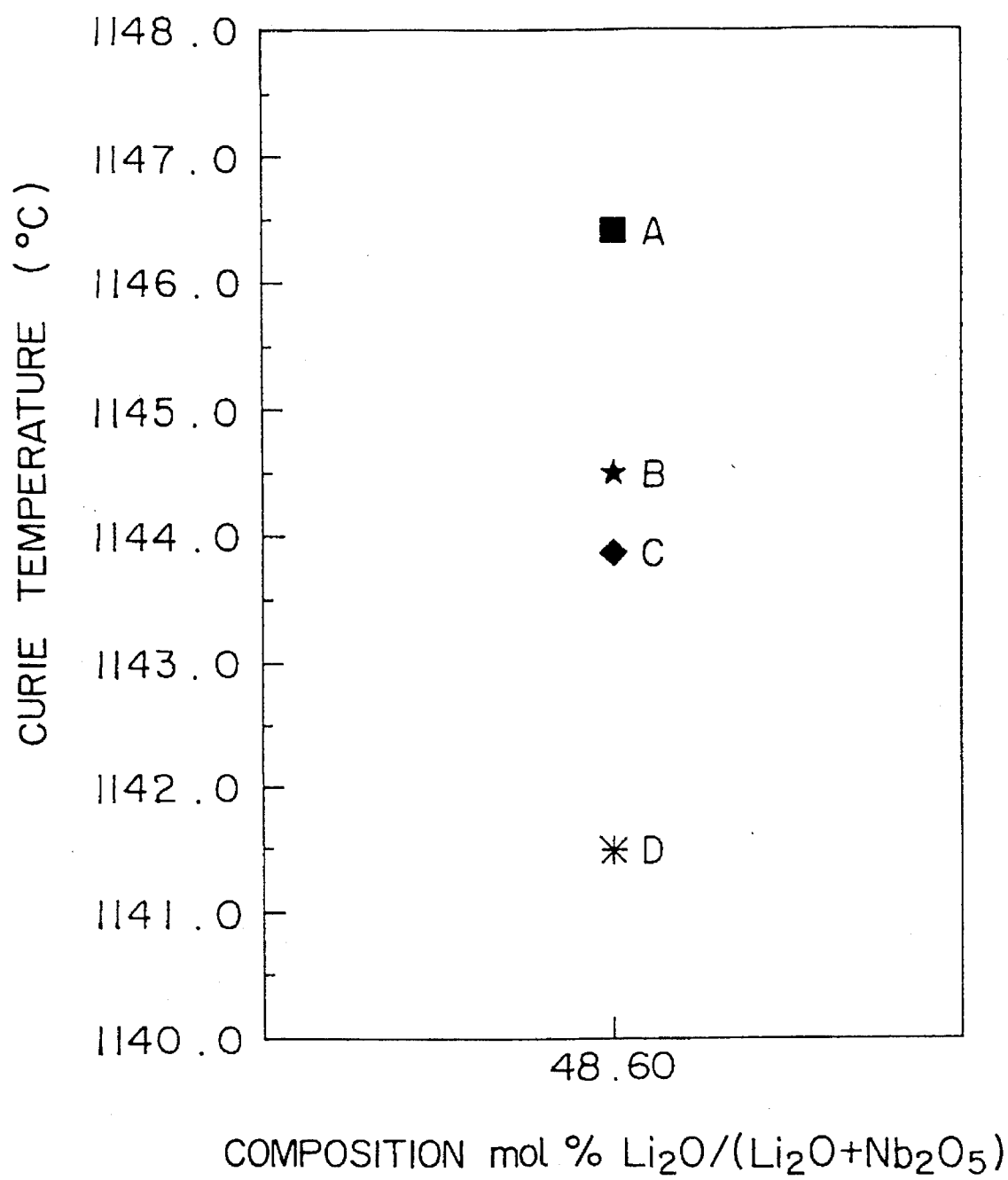
FIG. 3 is a graph indicating the scattering of the Curie point in crystals of the same composition containing impurities of quantities outside the limits prescribed in this invention.

As a comparison, we have prepared four starting materials (A to D) to which impurities more than the above stated allowable concentration specified are added and in each case measured the Curie point of an identical region by producing lithium niobate single crystals by the use of the product thus prepared. The concentrations of the impurities contained in these starting materials are shown in the following Table 3. Each crystal is grown from a melt solution having an identical 48.6% ($Li_2O/Li_2O+Nb_2O_5$) composition. The result obtained is shown in FIG. 3. As is apparent from these results, four members have Curie points that are separated from each other and are not excellent in reproducibility.

TABLE 3

Amount of respective impurities in crystal growing starting materials A to D (unit: ppm)

| | A | B | C | D | claims |
| --- | --- | --- | --- | --- | --- |
| Na | — | — | — | 2 | <5.0 |
| | <1 | <1 | <1 | <1 | <3.0 |
| K | — | — | — | 1 | <2.0 |
| | <1 | <1 | <1 | <1 | <1.0 |
| Mg | 0.05 | <0.05 | <0.05 | <1 | <0.5 |
| | <1 | <1 | <1 | <1 | <0.5 |

TABLE 3-continued

Amount of respective impurities in crystal growing starting materials A to D (unit: ppm)

| | A | B | C | D | claims |
| --- | --- | --- | --- | --- | --- |
| Al | 0.05 | <0.05 | <0.05 | <1 | <0.9 |
| | <1 | <1 | <1 | <1 | <0.9 |
| Cl | — | — | — | — | |
| | <30 | <30 | <30 | <5 | <30 |

Upper column: $Li_2CO_3$
Lower column: $Nb_2O_5$

According to this invention as described above, when a lithium niobate single crystal is produced by the use of lithium carbonate, niobium pentaoxide or both which contain elements of impurities Na, K, Mg and Al (or further Cl) within allowable concentrations as specified in this invention, evaluation of its composition can be accurately carried out. However, when impurities exceeding these allowable ranges are present, it is apparent that the evaluation cannot be accurately carried out, leading to poor reproduceability.

What is claimed is:

1. A process for producing a lithium niobate single crystal from lithium carbonate and niobium pentoxide, wherein said crystal has a variation in Curie point due to impurities of ±0.1° C., comprising growing a crystal from a melt solution of lithium carbonate and niobium pentoxide, wherein said lithium carbonate has a purity of at least 99.99% wherein said lithium carbonate may comprise Na, K, Mg, and Al impurities, and wherein the content of Na in said lithium carbonate is 5.0 ppm or less, the content of K in said lithium carbonate is 2.0 ppm or less, the content of Mg in said lithium carbonate is 0.5 ppm or less, and the content of Al in said lithium carbonate is 0.9 ppm or less.

2. A process for producing a lithium niobate single crystal from lithium carbonate and niobium pentoxide, wherein said crystal has a variation in Curie point due to impurities of ±0.1° C., comprising growing a crystal from a melt solution of lithium carbonate and niobium pentoxide, wherein said niobium pentoxide has a purity of at least 99.99% wherein said niobium pentoxide may comprise Na, K, Mg, Al and Cl impurities, and wherein the content of Na in said niobium pentoxide is 3.0 ppm or less, the content of K in said niobium pentoxide is 1.0 ppm or less, the content of Mg in said niobium pentoxide is 0.5 ppm or less, the content of Al in said niobium pentoxide is 0.9 ppm or less, and the content of Cl in said niobium pentoxide is 3.0 ppm or less.

3. A process according to claim 2, wherein said lithium carbonate has a purity of at least 99.99% wherein said lithium carbonate may comprise Na, K, Mg, and Al impurities, and wherein the content of Na in said lithium carbonate is 5.0 ppm or less, the content of K in said lithium carbonate is 2.0 ppm or less, the content of Mg in said lithium carbonate is 0.5 ppm or less, and the content of Al in said lithium carbonate is 0.9 ppm or less.

4. A lithium niobate single crystal produced by a process of claim 3.

5. A lithium niobate single crystal according to claim 4, which contains Na in a concentration of 15 ppm or less.

6. A lithium niobate single crystal according to claim 4, which contains K in a concentration of 7 ppm or less.

7. A lithium niobate single crystal according to claim 4, which contains Mg in a concentration of 3 ppm or less.

8. A lithium niobate single crystal according to claim 4, which contains Al in a concentration of 5 ppm or less.

9. A lithium niobate single crystal according to claim 4, which contains Cl in a concentration of 14 ppm or less.

10. A lithium niobate single crystal produced by a process of claim 2.

11. A lithium niobate single crystal produced by a process of claim 1.

* * * * *